(12) United States Patent
Bykanov et al.

(10) Patent No.: US 8,017,924 B2
(45) Date of Patent: Sep. 13, 2011

(54) DRIVE LASER DELIVERY SYSTEMS FOR EUV LIGHT SOURCE

(75) Inventors: Alexander N. Bykanov, San Diego, CA (US); Igor V. Fomenkov, San Diego, CA (US); Alexander I. Ershov, Escondido, CA (US)

(73) Assignee: Cymer, Inc., San Diego, CA (US)

( * ) Notice: Subject to any disclaimer, the term of this patent is extended or adjusted under 35 U.S.C. 154(b) by 291 days.

(21) Appl. No.: 12/322,669

(22) Filed: Feb. 4, 2009

(65) Prior Publication Data

US 2009/0267005 A1    Oct. 29, 2009

Related U.S. Application Data

(63) Continuation of application No. 11/580,414, filed on Oct. 13, 2006, now Pat. No. 7,491,954.

(51) Int. Cl.
*H01J 35/20* (2006.01)
(52) U.S. Cl. .................................................. 250/504 R
(58) Field of Classification Search ............. 250/504 R, 250/493.1; 378/119
See application file for complete search history.

(56) References Cited

U.S. PATENT DOCUMENTS

| | | | |
|---|---|---|---|
| 3,826,996 A | 7/1974 | Jaegle et al. | 331/94.5 |
| 6,549,551 B2 | 4/2003 | Ness et al. | 372/38.07 |
| 6,567,450 B2 | 5/2003 | Myers et al. | 372/55 |
| 6,625,191 B2 | 9/2003 | Knowles et al. | 372/55 |
| 6,968,850 B2 | 11/2005 | Chan et al. | 134/902 |
| 7,317,196 B2 * | 1/2008 | Partlo et al. | 250/504 R |
| 7,355,191 B2 | 4/2008 | Bykanov et al. | 250/504 R |
| 7,439,530 B2 | 10/2008 | Ershov et al. | 250/504 R |
| 7,482,609 B2 * | 1/2009 | Ershov et al. | 250/504 R |
| 7,518,787 B2 | 4/2009 | Bykanov et al. | 359/333 |
| 2004/0057475 A1 * | 3/2004 | Frankel et al. | 372/25 |
| 2006/0146906 A1 * | 7/2006 | Brown et al. | 372/57 |
| 2006/0176925 A1 | 8/2006 | Nakano | 372/69 |

(Continued)

FOREIGN PATENT DOCUMENTS

JP    2001143893    5/2001

OTHER PUBLICATIONS

Hribek, P., Vrbova, M., "Nd-glass laser with plasma mirror," AA, AB (Ceske Vysoke Uceni Technicke, Prague, Czechoslovakia); Czechoslovak Journal of Physics (ISSN 0011-4626), vol. B 35, No. 12, pp. 1331-1340 (1985).

(Continued)

*Primary Examiner* — Kiet Nguyen
(74) *Attorney, Agent, or Firm* — DiBerardino Law LLC

(57) ABSTRACT

An LPP EUV light source is disclosed having an optic positioned in the plasma chamber for reflecting EUV light generated therein and a laser input window. For this aspect, the EUV light source may be configured to expose the optic to a gaseous etchant pressure for optic cleaning while the window is exposed to a lower gaseous etchant pressure to avoid window coating deterioration. In another aspect, an EUV light source may comprise a target material positionable along a beam path to participate in a first interaction with light on the beam path; an optical amplifier; and at least one optic directing photons scattered from the first interaction into the optical amplifier to produce a laser beam on the beam path for a subsequent interaction with the target material to produce an EUV light emitting plasma.

25 Claims, 10 Drawing Sheets

U.S. PATENT DOCUMENTS

2006/0219957 A1 10/2006 Ershov et al. ............ 250/504
2007/0001131 A1 1/2007 Ershov et al. ............ 250/503.1

OTHER PUBLICATIONS

Kholin, I. V., "Electron-beam-controlled CO2 laser with plasma mirror," Akademiia Nauk SSSR, Fizicheskii Institut, Trudy, vol. 116, 1980, pp. 118-145, Journal of Soviet Laser Research, vol. 2. No. 1, p. 1-26, Jan-Mar. 1981.

Veisz, L.; Nomura, Y.; Schmidt, K.; Krausz, F.; Wittmann, T., "Plasma mirror with few-cycle laser pulses," Lasers and Electro-Optics Europe, 2005, CLEO/Europe, (2005 Conference), Jun. 12-17, 2005, p. 422, ISBN: 0-7803-8974-3.

U.S. Appl. No. 11/452,558, filed Jun. 14, 2006, Ershov et al.

EP Search Report dated Jun. 7, 2010, EP Patent Application No. 07838971.5 filed Sep. 27, 2007 (8 pages).

Fisher, Robert A. and Feldman, B.J., "On-resonant phase-conjugate reflection and amplification at 10.6 µm in inverted $CO_2$," *Los Alamos Scientific Laboratory*, University of California, Los Alamos, New Mexio, Optics Letters, vol. 4, No. 5 (May 1979).

Piche, et al, "Short Pulse Generation From Intracavity Laser Breakdown Plasmas," Optics Communications, vol. 24, No. 2, pp. 158-160 (Feb. 1978).

International Search Report dated May 21, 2008 from PCT Patent Application No. PCT/US2007/020897, filed on Sep. 27, 2007.

\* cited by examiner

DRIVE LASER DELIVERY SYSTEMS FOR EUV LIGHT SOURCE

CROSS-REFERENCE TO RELATED APPLICATIONS

The present application is a continuation of U.S. patent application Ser. No. 11/580,414, entitled DRIVE LASER DELIVERY SYSTEMS FOR EUV LIGHT SOURCE, filed on Oct. 13, 2006, the entire contents of which are hereby incorporated by reference herein.

The present application is related to co-pending, co-owned U.S. patent application Ser. No. 11/358,992, entitled LASER PRODUCED PLASMA EUV LIGHT SOURCE, filed on Feb. 21, 2006, the entire contents of which are hereby incorporated by reference herein.

The present application is also related to co-pending, co-owned U.S. patent application Ser. No. 11/174,299, entitled LLP EUV LIGHT SOURCE DRIVE LASER SYSTEM, filed on Jun. 29, 2005, the entire contents of which are hereby incorporated by reference herein.

The present application is also related to co-pending, co-owned U.S. patent application Ser. No. 11/452,558, entitled DRIVE LASER FOR EUV LIGHT SOURCE, filed on Jun. 14, 2006, the entire contents of which are hereby incorporated by reference herein.

FIELD

The present application relates to extreme ultraviolet ("EUV") light sources which provide EUV light from a plasma that is created from a target material and collected and directed for utilization outside of the EUV light source chamber, e.g., for semiconductor integrated circuit manufacturing photolithography, e.g., at wavelengths of around 50 nm and below.

BACKGROUND

Extreme ultraviolet ("EUV") light, e.g., electromagnetic radiation having wavelengths of around 50 nm or less (also sometimes referred to as soft x-rays), and including light at a wavelength of about 13 nm, can be used in photolithography processes to produce extremely small features in substrates, e.g., silicon wafers.

Methods to produce EUV light include, but are not necessarily limited to, converting a material into a plasma state that has an element, e.g., xenon, lithium or tin, with an emission line in the EUV range. In one such method, often termed laser produced plasma ("LPP") the required plasma can be produced by irradiating a target material, for example in the form of a droplet, stream or cluster of material, with a laser beam.

For this process, the plasma is typically produced in a sealed vessel, e.g., vacuum chamber, and monitored using various types of metrology equipment. In addition to generating EUV radiation, these plasma processes also typically generate undesirable by-products in the plasma chamber which can include out-of-band radiation, high energy ions and debris, e.g., atoms and/or clumps/microdroplets of the target material.

These plasma formation by-products can potentially heat, damage or reduce the operational efficiency of the various plasma chamber optical elements including, but not limited to, collector mirrors including multi-layer mirrors (MLM's) capable of EUV reflection at normal incidence and/or grazing incidence, the surfaces of metrology detectors, windows used to image the plasma formation process, and the laser input window. The heat, high energy ions and/or debris may be damaging to the optical elements in a number of ways, including coating them with materials which reduce light transmission, penetrating into them and, e.g., damaging structural integrity and/or optical properties, e.g., the ability of a mirror to reflect light at such short wavelengths, corroding or eroding them and/or diffusing into them. For some target materials, e.g., tin, it may be desirable to introduce an etchant, e.g., HBr into the plasma chamber to etch material, e.g. debris that has deposited on the optical elements. It is further contemplated that the affected surfaces of the elements may be heated to increase the reaction rate of the etchant.

As indicated above, one technique to produce EUV light involves irradiating a target material. In this regard, $CO_2$ lasers, e.g., outputting light at 10.6 μm wavelength, may present certain advantages as a drive laser irradiating the target material in an LPP process. This may be especially true for certain target materials, e.g., materials containing tin. For example, one advantage may include the ability to produce a relatively high conversion efficiency between the drive laser input power and the output EUV power. Another advantage of $CO_2$ drive lasers may include the ability of the relatively long wavelength light (for example, as compared to deep UV at 198 nm) to reflect from relatively rough surfaces such as a reflective optic that has been coated with tin debris. This property of 10.6 μm radiation may allow reflective mirrors to be employed near the plasma for, e.g., steering, focusing and/or adjusting the focal power of the drive laser beam. However, for 10.6 μm drive lasers, the window inputting the laser into the plasma chamber is typically made of ZnSe and coated with an anti-reflection coating. Unfortunately, these materials may be sensitive to certain etchants, e.g., bromides.

In addition to the challenges presented by plasma generated debris, it can be difficult to consistently and accurately hit a series of moving droplets with a pulsed laser beam. For example, some high-volume EUV light sources may call for the irradiation of droplets having a diameter of about 20-50 μm and moving at a velocity of about 50-100 m/s.

With the above in mind, Applicants disclose systems and methods for effectively delivering and focusing a laser beam to a selected location in an EUV light source.

SUMMARY

In an aspect of an embodiment of the present application, an EUV light source may comprise a target material, a laser device, e.g., a $CO_2$ laser device, a plasma chamber and an optic positioned in the plasma chamber for reflecting EUV light generated therein. For this aspect, the EUV light source may also comprise a gaseous etchant disposed in the plasma chamber at a first pressure, $p_1$, and a beam delivery chamber having an input window for passing a laser beam from the laser device into the beam delivery chamber. For the light source, the beam delivery chamber may be formed with an opening to output the laser beam for interaction with the target material to create an EUV light emitting plasma and the delivery chamber may have a gaseous etchant pressure, $p_2$, with $p_1 > p_2$.

In one embodiment, the EUV light source may further comprise a focusing optic disposed in the delivery chamber. In one arrangement, the focusing optic focuses the laser beam to a focal spot at the delivery chamber opening, in another arrangement the focusing optic focuses the laser beam to a focal spot at a location in the delivery chamber, and in a particular arrangement, the focal spot location is near the delivery chamber opening.

In a particular embodiment, the EUV light source as may further comprise a focusing optic, e.g., a focusing mirror, disposed in the plasma chamber for focusing the laser beam to a focal spot in said plasma chamber. For the light source, the input window may be made of ZnSe and may be coated with an anti-reflection coating, the target material comprises tin, and the etchant may be HBr, HI, $Br_2$, $Cl_2$, HCl, $H_2$ or combinations thereof.

In one setup, an intermediate chamber is provided for receiving the laser beam from the delivery chamber. For this setup, the intermediate chamber may be formed with an opening for passing the laser beam into the plasma chamber. An evacuation pump may be provided for maintaining the pressure, $p_1$, in the delivery chamber and, for some implementations, a saturable absorber material, e.g. a gas suitable for the laser beam wavelength, may be disposed in the delivery chamber.

In another aspect of an embodiment of the present application, an EUV light source may comprise a target material, a laser device outputting a laser beam, a plasma chamber and an intermediate chamber formed with an opening to output the laser beam to the plasma chamber for interaction with the target material to create an EUV light emitting plasma. For this aspect, the light source may also comprise a beam delivery chamber having an input window for passing the laser beam from the laser device into the beam deliver chamber. For the light source, the delivery chamber may be formed with an opening to output a laser beam to the intermediate chamber and an optic may be disposed in the delivery chamber to focus the laser beam to a focal spot within the intermediate chamber.

In one embodiment, a nozzle may be provided for establishing a gas curtain in the intermediate chamber. In one arrangement, a gaseous etchant may be disposed in the plasma chamber and an evacuation pump may be provided to remove etchant from the delivery chamber. In a particular application, the etchant comprise Br, e.g., HBr, $Br_2$, etc., and the input window may be made of ZnSe and coated with an anti-reflection coating.

In yet another aspect of an embodiment of the present application, an EUV light source may comprise a vessel having a laser input window, a laser device outputting a laser beam and a material disposed in the vessel for interaction with the laser beam to create an EUV light emitting plasma. For this aspect, the light source may also comprise an optic positioned in the vessel for reflecting the EUV light and a means for exposing the optic to a gaseous etchant at a concentration sufficient to etch plasma-generated debris from the optic while exposing the input window to a substantially reduced concentration of gaseous etchant. In one embodiment, the exposing means may comprise a beam delivery chamber within the vessel and a plasma chamber within the vessel, the delivery chamber formed with an opening to output the laser beam for interaction with the target material in the plasma chamber. In a particular embodiment, the exposing means may further comprise an evacuation pump to remove gaseous etchant from the delivery chamber.

In still another aspect of an embodiment of the present application, an EUV light source may comprise a target material; at least one optic establishing a beam path with the target material and an optical gain medium positioned along the beam path producing an amplified photon beam for interaction with the target material to produce an EUV light emitting plasma without a seed laser providing output photons to the beam path.

In one embodiment of this aspect, the at least one optic and the target material may cooperate to establish an optical oscillator and the at least one optic is selected from the group of optics consisting of a flat mirror, a curved mirror, a corner reflector and a phase-conjugate mirror. In another embodiment of this aspect, the at least one optic and the target material may cooperate to establish beam path having a ring shaped portion, e.g. the at least one optic may comprise three turning mirrors.

For this aspect, the target material may be in the form of a droplet, may comprise tin, and the amplifier may be a $CO_2$ laser amplifier or may comprise a solid-state, disk shaped gain medium.

In one implementation of this aspect, the EUV light source may further comprise an optical isolator positioned along the beam path between the target material and amplifier, and in a particular implementation, the amplifier may have a primary polarization direction and the optical isolator may comprise a phase retarding optic and a polarizer.

For the EUV light source of this aspect, the amplifier may include a plurality of amplifier chambers, a collimating optic may be disposed between the target material and amplifier, and a switch may be provided for preserving the optical gain medium during at least a portion of a time period when target material is not on the beam path.

In one arrangement of this aspect, the at least one optic and the target material cooperate to establish beam path having a ring shaped portion and the EUV light source may further comprise a Faraday Isolator and/or an attenuator and/or a switch for preserving the optical gain medium during at least a portion of a time period when target material is not on the beam path and/or a spatial filter and/or an optical isolator.

In another aspect of an embodiment of the present application, an EUV light source may comprise a target material; at least one optic establishing a beam path with the target material; an optical oscillator having an oscillator gain medium, the optical oscillator coupled with the beam path to provide an initial photon interaction with the target material; and an optical gain medium positioned along the beam path producing an amplified photon beam after the initial photon interaction, the amplified photon beam for interaction with the target material to produce an EUV light emitting plasma.

In one embodiment of this aspect, the at least one optic and the target material may cooperate to establish an optical oscillator and the at least one optic is selected from the group of optics consisting of a flat mirror, a curved mirror, a corner reflector and a phase-conjugate mirror. In another embodiment of this aspect, the at least one optic and the target material may cooperate to establish beam path having a ring shaped portion, e.g. the at least one optic may comprise three turning mirrors.

For this aspect, the target material may be in the form of a droplet, may comprise tin, and the amplifier may be a $CO_2$ laser amplifier or may comprise a solid-state, disk shaped gain medium.

In one implementation of this aspect, the EUV light source may further comprise an optical isolator positioned along the beam path between the target material and amplifier, and in a particular implementation, the amplifier may have a primary polarization direction and the optical isolator may comprise a phase retarding optic and a polarizer.

For the EUV light source of this aspect, the amplifier may include a plurality of amplifier chambers, a collimating optic may be disposed between the target material and amplifier, and a switch may be provided for preserving the optical gain medium during at least a portion of a time period when target material is not on the beam path.

In one arrangement of this aspect, the at least one optic and the target material cooperate to establish beam path having a ring shaped portion and the EUV light source may further comprise a Faraday Isolator and/or an attenuator and/or a switch for preserving the optical gain medium during at least a portion of a time period when target material is not on the beam path and/or a spatial filter and/or an optical isolator.

In another aspect of an embodiment of the present application, an EUV light source may comprise a target material positionable along a beam path to participate in a first interaction with light on the beam path; an optical amplifier; and at least one optic directing photons scattered from the first interaction into the optical amplifier to produce a laser beam on the beam path for a subsequent interaction with the target material to produce an EUV light emitting plasma.

DETAILED DESCRIPTION

Figure 1:
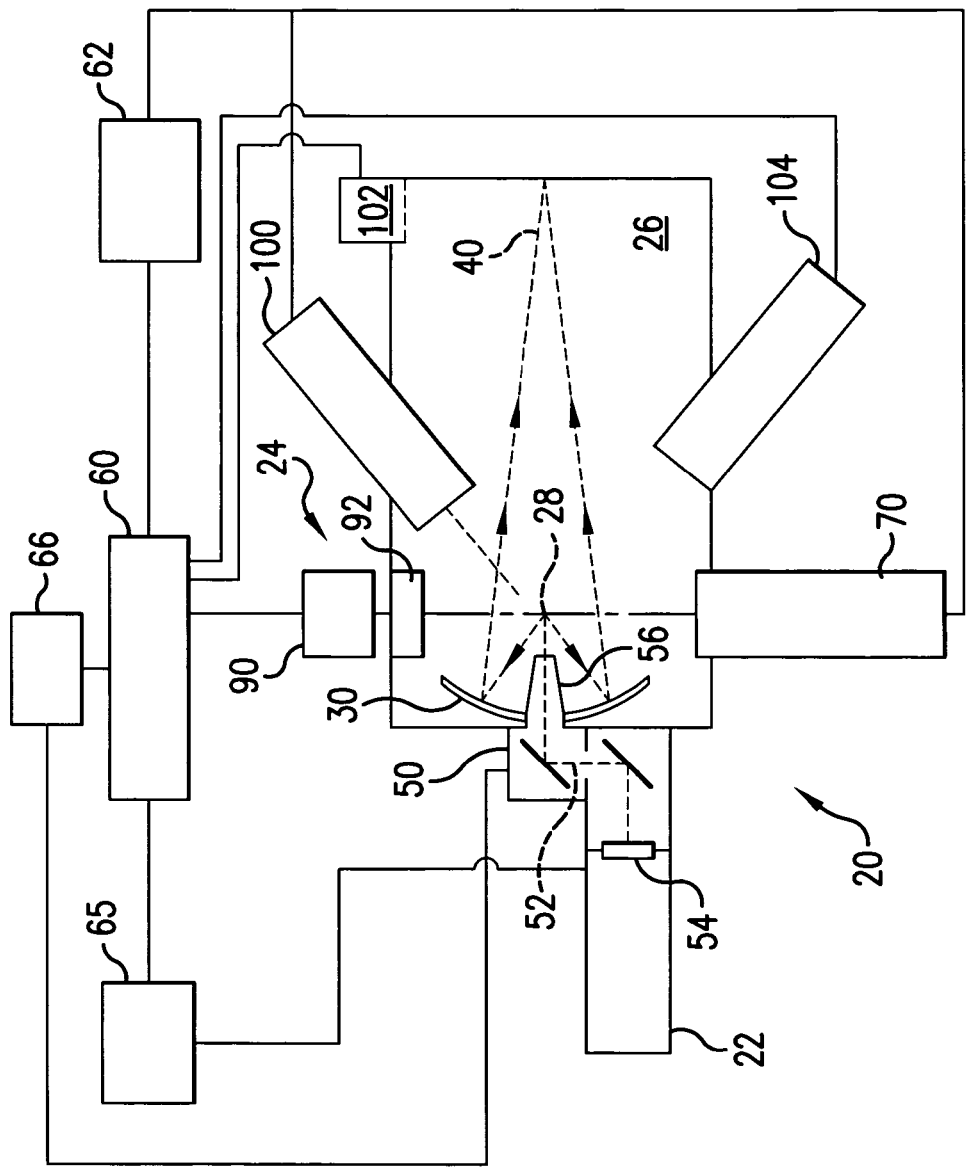
FIG. 1 shows a schematic, concept level, view of a laser-produced plasma EUV light source according to an aspect of the present application.

With initial reference to FIG. 1 there is shown a schematic view of an exemplary EUV light source, e.g., a laser produced plasma EUV light source 20 according to an aspect of the present invention. As shown, the EUV light source 20 may contain a pulsed laser device 22, e.g., a pulsed gas discharge $CO_2$, excimer or molecular fluorine laser device operating at high power and high pulse repetition rate. Depending on the application, other types of laser devices may also be suitable. For example, for some aspects of the present disclosure, a solid state laser, a two chamber, oscillator-amplifier, e.g., MOPA, configured excimer laser device, e.g., as shown in U.S. Pat. Nos. 6,625,191, 6,549,551, and 6,567,450, an excimer laser having a single chamber, an excimer laser having two or more chambers, e.g., an oscillator chamber and one or more amplifying chambers (with the amplifying chambers in parallel or in series), a master oscillator/power oscillator (MOPO) arrangement, a power oscillator/power amplifier (POPA) arrangement, or a solid state laser that seeds one or more excimer or molecular fluorine amplifier or oscillator chambers, may be suitable. Other designs are possible.

The EUV light source 20 may also include a target material delivery system 24, e.g., delivering target material in the form of liquid droplets, a liquid stream, solid particles or clusters, solid particles contained within liquid droplets or solid particles contained within a liquid stream. The target material may include for example water, tin, lithium, xenon, etc. For example, the element tin may be used as pure tin, as a tin compound, e.g., $SnBr_4$, $SnBr_2$, $SnH_4$, as a tin alloy, e.g., tin-gallium alloys, tin-indium alloys, tin-indium-gallium alloys, or a combination thereof. The target material may be delivered by the target material delivery system 24, e.g., into the interior of a chamber 26 to an irradiation site 28 where the target material will be irradiated and produce a plasma.

A beam delivery system 50 may be provided to deliver a laser beam from the laser device 22, e.g., a beam of laser pulses, along a laser optical axis 52 into the plasma chamber 26 to the irradiation site 28. At the irradiation site, the laser, suitably focused, may be used to create a plasma having certain characteristics which depend on the composition of the target material. These characteristics may include the wavelength of the EUV light produced by the plasma and the type and amount of debris released from the plasma. As shown, the beam deliver system 50 may have an input window 54 for passing a laser beam from the laser device 22 into the beam delivery system 50 for subsequent input into the plasma chamber 26.

Continuing with FIG. 1, the EUV light source 20 may also include a collector mirror 30, e.g., a reflector, e.g., in the form of an ellipsoid, with an aperture to allow the laser light to pass through and reach the irradiation site 28. The collector 30 may be, e.g., an ellipsoidal mirror that has a first focus at the irradiation site 28 and a second focus at a so-called intermediate point 40 (also called the intermediate focus 40) where the EUV light may be output from the light source 20 and input to, e.g., an integrated circuit lithography tool (not shown). FIG. 1 also shows that the EUV light source may include an open-ended, hollow conical shroud 56 (i.e. a so-called gas cone) which tapers toward the irradiation site 28 from the collector 30 to reduce the amount of plasma generated debris which enters the beam delivery system 50 while allowing the laser beam to reach the irradiation site. For this purpose, a gas flow may be provided in the shroud that is directed toward the irradiation site 28.

The light source 20 may also include an EUV light source controller system 60, which may also include, e.g., a droplet position detection feedback system 62 and a laser firing control system 65, along with, e.g., a laser beam positioning system controller 66. The light source 20 may also include a droplet position detection system which may include one or more droplet imagers 70 that provide an output indicative of the position of a droplet, e.g., relative to the irradiation site 28 and provide this output to the droplet position detection feedback system 62, which can, e.g., compute a droplet position and trajectory, from which a droplet position error can be computed, if not on a droplet by droplet basis then on average. The droplet position error may then be provided as an input to the light source controller 60, which can, e.g., provide a laser position, direction and timing correction signal, e.g., to the laser beam positioning controller 66 that the laser beam positioning system can use, e.g., to control the laser timing circuit and/or to control a laser beam position and shaping system (not shown), e.g., to change the location and/or focal power of the laser beam focal spot within the chamber 26.

Also shown in FIG. 1, the EUV light source 20 may include a target material delivery control system 90 for, operable in response to a signal from the system controller 60 to e.g., modify the release point of the droplets as released by the delivery mechanism 92 to correct for errors in the droplets arriving at the desired irradiation site 28. An EUV light source detector 100 may be provided to measure one or more EUV light parameters, including but not limited to, pulse energy, energy distribution as a function of wavelength, energy within a particular band of wavelengths, energy outside of a particular band of wavelengths, angular distribution of EUV intensity and/or average power, and generate a feedback signal for use by the system controller 60 that can be, for example, indicative of the errors in parameters such as the timing and focus of the laser pulses to properly intercept the droplets in the right place and time for effective and efficient EUV light production. Although the detector 100 is shown positioned to receive light directly from the irradiation site 28, it is to be appreciated the detector could also be positioned to sample light at or downstream of the intermediate focus 40 or some other location.

For the light source 20 shown in FIG. 1, irradiation of the target material may generate a plasma, and in some cases, debris may be generated at the irradiation site 28 which may contaminate the surfaces of optical elements including but not limited to the collector mirror 30. As shown, a source 102 of a gaseous etchant capable of reaction with constituents of the target material may be introduced into the chamber 26 to clean contaminants that have deposited on surfaces of optical elements. For example, an HBr concentration of a few Torr can be used. In one application, the target material may include Sn and the etchant may be HBr, $Br_2$, $Cl_2$, HCl, $H_2$, $HCF_3$ or a combination thereof.

Continuing with FIG. 1, the EUV light source 20 may include one or more heater(s) 104 to initiate and/or increase a rate of a chemical reaction between deposited target material and the etchant on a surface of an optical element. For example, for a target material including Sn used together with an HBr etchant, the heater 104 may heat the contaminated surface of an optical element, e.g., laser input window 54, to a temperature in the range of 150 to 400° C., and for some applications greater than 400° C. For a plasma target material which comprises Li, the heater 104 may be designed to heat the surface of one or more optical elements to a temperature in the range of about 400 to 550° C. to vaporize Li from the surface (i.e., without necessarily using an etchant). Types of heaters which may be suitable include, but are not necessarily limited to radiative heaters, microwave heaters, RF heaters, ohmic heaters and combinations thereof. The heater(s) may be directed to a specific optical element surface, and thus be directional, or may be non-directional and heat the entire chamber or substantial portions thereof.

Figure 2:
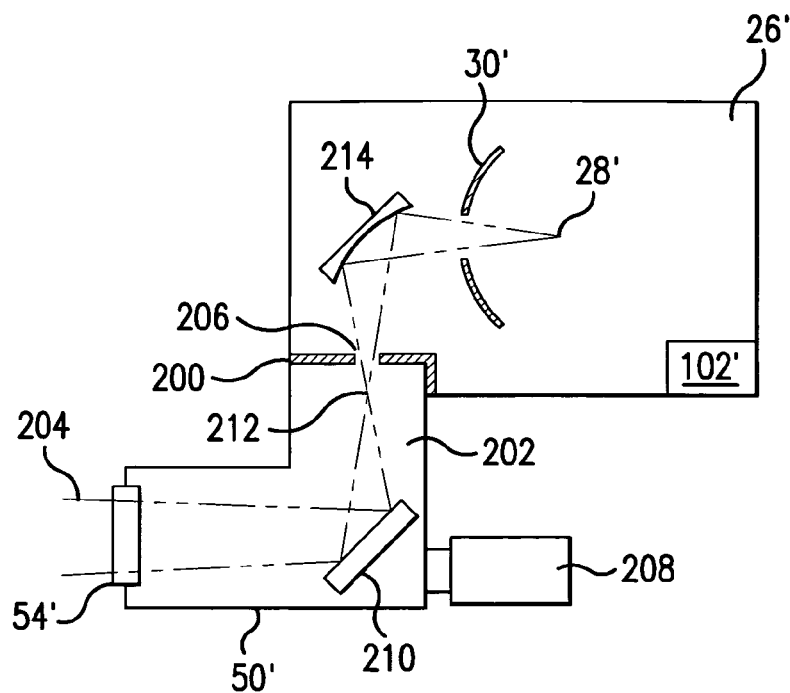
FIG. 2 shows a schematic, sectional view of a beam delivery system for a laser-produced plasma EUV light source.

FIG. 2 shows an aspect of an embodiment in which a vessel 200 includes two portions, a beam delivery system 50' and an EUV plasma chamber 26'. As shown, the beam delivery system 50' may include a beam delivery chamber 202 having an input window 54' for passing a laser beam 204 from the laser device (see FIG. 1) into the beam delivery chamber 202. As further shown in FIG. 2, the delivery chamber 202 may be formed with an opening 206, e.g., a relatively narrow opening, to pass the laser beam 204 into the chamber 26' for interaction with a target material to create an EUV light emitting plasma. With this arrangement, a gaseous etchant pressure differential may be established between the chamber 26' and the beam delivery chamber 202. Thus, in one implementation, the total pressures in each chamber 26', 202 may be approximately equal with a relatively high gaseous etchant partial pressure maintained in the chamber 26' (introduced by source 102') and a relatively low gaseous etchant partial pressure maintained in the beam delivery chamber 202. For example, the chamber 202 may have a larger amount of inert species than the chamber 26'. Alternatively, each chamber 26', 202 may have about the same chemical composition, with a relatively high total pressure maintained in the chamber 26' (introduced by source 102') and a relatively low total pressure maintained in the beam delivery chamber 202. A third embodiment having differing total pressures and differing chemical compositions may also be suitable.

As FIG. 2 shows, an evacuation pump 208 may be provided, if required for a particular application, to augment the opening 206 in maintaining the gaseous etchant pressure differential between the chamber 26' and the beam delivery chamber 202. For the beam delivery system 50', a focusing optic 210 may be disposed in the beam delivery chamber 202 to focus the laser beam 204 to a focal spot 212 at a location in the delivery chamber 202 proximate the opening 206. Depending on the intensity of the beam 204 and the pressures in the chamber 26' and delivery chamber 202, the focal spot 212 may be placed closer to, and in some cases, at the opening 206. In this regard, a typically design may place the focal spot such that substantial optical breakdown of the gas does not occur. Although a single reflective mirror is shown for the focusing optic 210 in FIG. 2, it is to be appreciated that for cases where the presence of debris in the delivery chamber 202 is insubstantial, the focusing optic 210 may instead be one or more, prisms, lenses, mirrors, etc. With the above-described structure, the input window 54' may be made of ZnSe that is coated with an anti-reflection coating, and an etchant, e.g., HBr, HI, $Br_2$, $Cl_2$, HCl, $H_2$ or combinations thereof may be disposed in the chamber 26' in effective concentrations (i.e. concentrations sufficient to etch deposits from the optic 214) without adversely affecting the input window 54'.

Continuing with FIG. 2, it can be seen that the beam 204 may expand from the focal spot 212, pass through the opening 206, and be made incident upon a reflective focusing optic 214, as shown. FIG. 2 illustrates that the focusing optic 214 may be configured and aligned to produce a converging beam which is directed at the irradiation site 28' through an opening in the collector mirror 30'. Although the optic 214 is shown as a single mirror in FIG. 2, it is to be appreciated that the optic 214 may include more than one mirror, and in addition to focusing the beam 204, the optic 214 may actively steer the beam 204 in response to a control signal to selectively move the focal spot within the chamber 26'. For example, optic 214 may include a plurality of mirrors, moveable together to move the focal spot along the beam axis, with one of the mirrors mounted on a tip-tilt actuator for movement of the focal spot in directions normal to the beam axis. Such an arrangement is disclosed and claimed in co-pending, co-owned U.S. patent application Ser. No. 11/358,992, entitled LASER PRODUCED PLASMA EUV LIGHT SOURCE, filed on Feb. 21, 2006, the disclosure of which has been previously incorporated by reference herein.

In some implementations, relatively small amounts of tin from a tin containing target material may be allowed to deposit on the optic 214 without substantially affecting the optics reflectivity of relatively long wavelength light, e.g. 10.6 μm. For example, a mirror coated with a relatively smooth layer of tin may reflect about 96% of 10.6 μm radiation. In this regard, rotation of the optic may be utilized to ensure a smooth deposit of tin. The use of mirrors that are slightly coated with tin and the use of rotating mirrors are disclosed in co-pending, co-owned U.S. patent application Ser. No. 11/174,299, entitled LLP EUV LIGHT SOURCE DRIVE LASER SYSTEM, filed on Jun. 29, 2005, the disclosure of which has been previously incorporated by reference herein.

Figure 3:
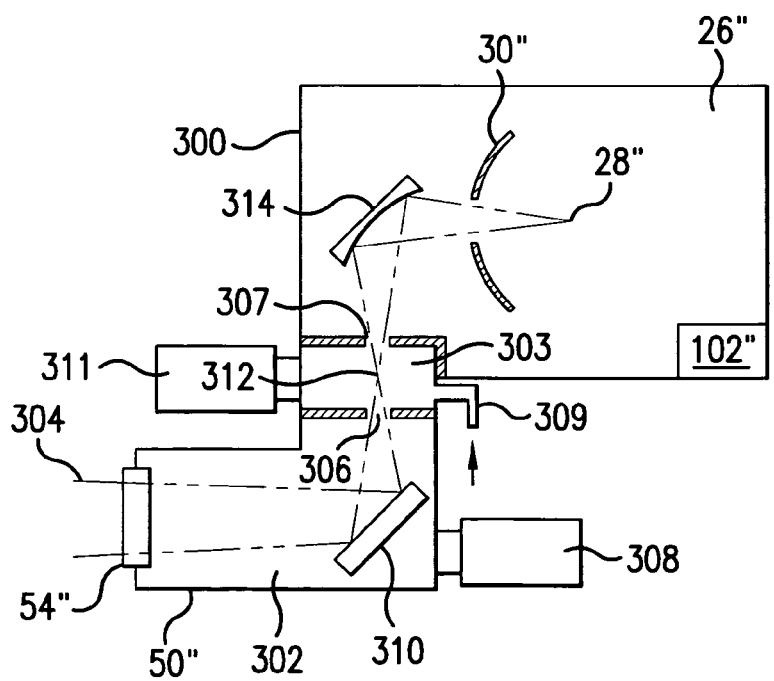
FIG. 3 shows a schematic, sectional view of another embodiment of a beam delivery system for a laser-produced plasma EUV light source.

FIG. 3 shows another aspect of an embodiment in which a vessel 300 includes two portions, a beam delivery system 50" and an EUV plasma chamber 26". As shown, the beam delivery system 50" may include a beam delivery chamber 302 and an intermediate chamber 303. The delivery chamber 302 may have an input window 54" for passing a laser beam 304 from the laser device (see FIG. 1) into the beam deliver chamber 302.

As further shown in FIG. 3, the delivery chamber 302 may be formed with an opening 306, e.g., a relatively narrow opening, to pass the laser beam 304 into the intermediate chamber 303. Also, the intermediate chamber 303 may be formed with an opening 307, e.g., a relatively narrow opening, to output the laser beam 304 to the chamber 26" for interaction with a target material to create an EUV light emitting plasma. FIG. 3 also shows that a nozzle 309 may be provided for establishing a gas curtain in the intermediate chamber 303, e.g., across the opening 306, e.g., to prevent gas and/or debris from entering the delivery chamber 302. As shown, the gas curtain may exit the intermediate chamber 303 via evacuation pump 311. With this arrangement, a relatively high gaseous etchant pressure, (introduced by source 102") may be maintained in the chamber 26" to effectively clean optics therein and a relatively low gaseous etchant pressure may be maintained in the beam delivery chamber 302. Thus, with this arrangement, the laser input window 54" may not be exposed to a relatively high concentration of etchant which may degrade the window or the window's anti-reflective coating. As FIG. 3 further shows, an evacuation pump 308 may be provided, if required for a particular application, to augment the opening 306 and gas curtain and thereby prevent substantial amounts of etchant and/or debris from entering the beam delivery chamber 302. With the above-described structure, the input window 54" may be made of ZnSe that is coated with an anti-reflection coating, and an etchant, e.g., HBr, HI, $Br_2$, $Cl_2$, HCl, $H_2$ or combinations thereof may be disposed in the chamber 26" in effective concentrations sufficient to etch deposits from the optic 314.

Continuing with FIG. 3, a focusing optic 310 may be disposed in the beam delivery chamber 302 for focusing the laser beam 304 to a focal spot 312 at a location in the intermediate chamber 303. Although a single reflective mirror is shown for the focusing optic 310 in FIG. 3, it is to be appreciated that for cases where the presence of debris in the delivery chamber 302 is insubstantial, the focusing optic 310 may instead be one or more, prisms, lenses, mirrors etc.

From FIG. 3, it can be seen that the beam 304 may expand from the focal spot 312, pass through the opening 307 and is made incident upon a reflective focusing optic 314, as shown. FIG. 3 illustrates that the focusing optic 314 may be configured and aligned to produce a converging beam which is directed at the irradiation site 28" through an opening in the collector 30". Although the optic 314 is shown as a single mirror in FIG. 3, it is to be appreciated that the optic 314 may include more than one mirror, and in addition to focusing the beam 304, the optic 314 may actively steer the beam 304 in response to a control signal to selectively move the focal spot within the chamber 26". For example, optic 314 may include a plurality of mirrors, moveable together to move the focal spot along the beam axis, with one of the mirrors mounted on a tip-tilt actuator for movement of the focal spot in directions normal to the beam axis. Such as arrangement is disclosed and claimed in co-pending, co-owned U.S. patent application Ser. No. 11/358,992, entitled LASER PRODUCED PLASMA EUV LIGHT SOURCE, filed on Feb. 21, 2006, the disclosure of which has been previously incorporated by reference herein.

In some implementations, relatively small amounts of tin from a tin containing target material may be allowed to deposit on the optic 314 without substantially affecting the optics reflectivity of relatively long wavelength light, e.g., 10.6 μm. For example, a mirror coated with a relatively smooth layer of tin may reflect about 96% of 10.6 μm radiation. In this regard, the use of mirrors that are slightly coated with tin and the use of rotating mirrors are disclosed in co-pending, co-owned U.S. patent application Ser. No. 11/174,299, entitled LLP EUV LIGHT SOURCE DRIVE LASER SYSTEM, filed on Jun. 29, 2005, the disclosure of which has been previously incorporated by reference herein.

Figure 4:
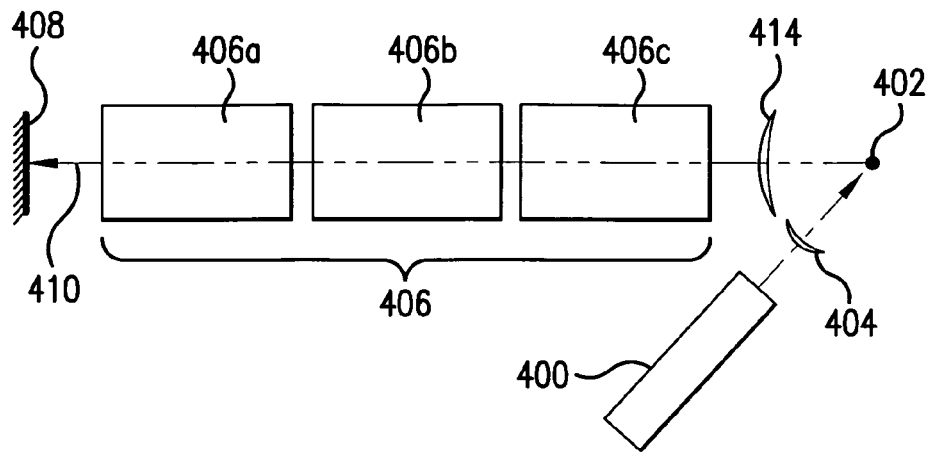
FIG. 4 shows a schematic, sectional view of a self targeting drive laser for a laser-produced plasma EUV light source.

FIG. 4 shows another aspect of an embodiment of the present application in which an EUV light source may comprise a radiant energy supply 400, e.g., a lamp or laser device emitting light of a desired wavelength, λ. Also shown, the EUV light source may include a target material 402, e.g., tin droplet moving on a linear trajectory from a droplet generator. As shown, a focusing element 404 may be provided to focus the light from the radiant energy supply 400 onto the target material 402. The EUV light source may further comprise an optical amplifier 406*a,b,c* having a gain media capable of optically amplifying the desired wavelength, λ, e.g., a high gain (G≧1,000 and in some cases 10,000) CW pumped, $CO_2$ laser amplifier amplifying light at a wavelength of 10.6 μm. As shown, the amplifier 406 may include a chain of amplifier chambers 406a-c, arranged in series, each chamber having its own active media and excitation source, e.g. electrodes. Although three amplifier chambers 406a-c are shown, it is to be appreciated that more than three and as few as one amplifier chambers may be used in the embodiments shown in FIGS. 4-14.

In use, a droplet of target material 402 is placed on a trajectory passing through or near a beam path 410 which extends through the amplifier 406. In one implementation, photons from the radiant energy supply 400 may be scattered by the droplet and some scattered photons may be placed on path 410 where they travel though the amplifier 406. As shown, an optic 408 may be positioned to receive photons exiting the amplifier on path 410 and direct the photons back through the amplifier 406 for subsequent interaction with the target material 402 to produce an EUV light emitting plasma. Amplified photons may also be scattered, e.g. reflected, from the line-emitting material 402 back into the amplifier 406, and thus the optic 408 and line-emitting material 402 may establish an oscillator cavity. For the arrangement shown in FIG. 4, the optic 408 may be, for example, a flat mirror, curved mirror, phase-conjugate mirror or corner reflector. An optical element 414, e.g., lens may be positioned to collimate light entering the amplifier 406 on path 410 and focus light on path 412, as shown.

It will be appreciated by the skilled artisan that irradiation of a target material 402 will alter the materials reflectivity along the beam path due to changes in the materials absorptance, size and radius of curvature (e.g. as the droplet expands) number of free electrons, e.g. as a metal, vapor and subsequently as a plasma, etc. Thus, in one implementation of the embodiment shown in FIG. 4, the EUV light source may be configured so that when a droplet of target material 402 initially reaches the beam path 410, its reflectivity is low and cavity losses exceed gains for the amplifier 406. Irradiation of the droplet by the radiant energy supply 400 alters the droplet's reflectivity until gains exceed losses in the amplifier cavity and a relatively high power laser beam is generated on the beam path 410 which interacts with the target material 402. The target material 402 then leaves the path 410 and the process is repeated with another droplet. The arrangement shown in FIG. 4 may be advantageous in that it is self-targeting, to the extent that the droplet passes near or through the beam path 410. Thus, for the EUV light source shown in FIG. 4, the radiant energy supply 400 may produce light at wavelengths within the gain band of the amplifier 406 (in which case photons scattered from the droplet may initiate lasing in the amplifier), or, the radiant energy supply 400 may produce light at wavelengths that are outside the gain band of the amplifier 406 (in which case the radiant energy supply 400 may function to increase the reflectivity of the droplet, e.g. ignite a plasma mirror), and a spontaneously emitted photon generated by the amplifier gain media may initiate lasing in the amplifier 406.

For the embodiment shown in FIG. 4, the initial irradiation of the target material by the radiant energy supply 400 may be sufficient to expand the target material and/or vaporize the target material and/or create a partial plasma of the target material, e.g., a pre-pulse. Depending on the specific application, utilization of a pre-pulse followed by one or more main pulses may result in improved conversion efficiency and/or a reduction in the amount of debris generated.

Figure 5:
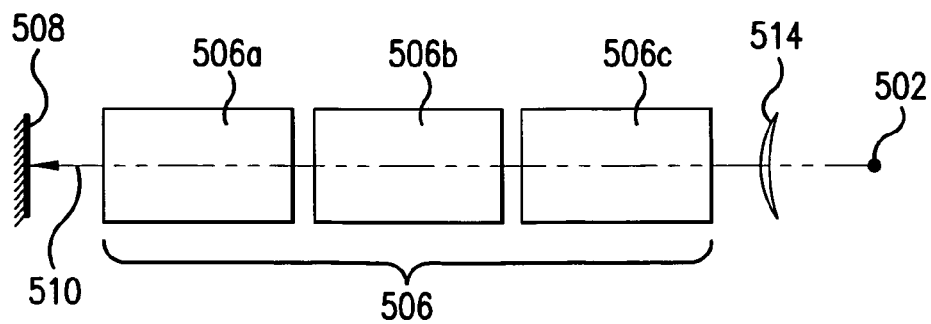
FIG. 5 shows a schematic, sectional view of another embodiment of a self targeting drive laser for a laser-produced plasma EUV light source.

FIG. 5 shows another aspect of an embodiment of the present application in which an EUV light source may comprise an optical amplifier 506a,b,c and a target material 502, e.g., tin droplet moving on a linear trajectory from a droplet generator. For example, the optical amplifier 506 may be a CW pumped, multiple chamber, $CO_2$ laser amplifier amplifying light at a wavelength of 10.6 μm and having a relatively high two-pass gain (e.g. a two pass gain of about 10,000). As shown, the amplifier 506 may include a chain of amplifier chambers 506a-c, arranged in series. As shown, the amplifier 506 may include a chain of amplifier chambers 506a-c, arranged in series, each chamber having its own active media and excitation source, e.g. electrodes.

In use, a droplet of target material 502 is placed on a trajectory passing through or near a beam path 510 extending through the amplifier 506. Spontaneously emitted photons from the amplifier 506 may be scattered by the droplet and some scattered photons may be placed on path 510 where they travel though the amplifier 506. As shown, an optic 508 may be positioned to receive the photons on path 510 from the amplifier 506 and direct the beam back through the amplifier 506 for subsequent interaction with the target material 502 to produce an EUV light emitting plasma. For this arrangement, the optic 508 may be, for example, a flat mirror, curved mirror, phase-conjugate mirror or corner reflector. An optical element 514, e.g., lens may be positioned to collimate light entering the amplifier 506 from the droplet and focus light traveling from the amplifier 506 to the droplet.

Figure 6:
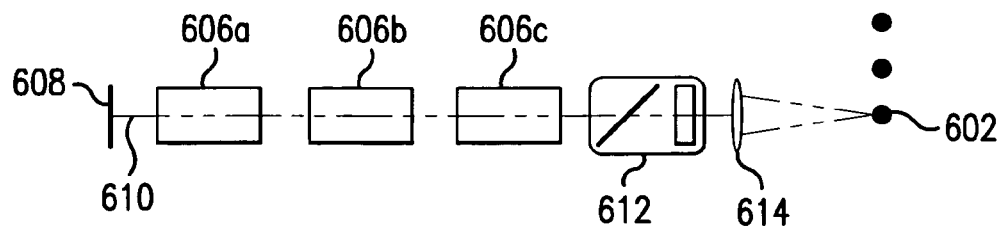
FIG. 6 shows a schematic, sectional view of another embodiment of a self targeting drive laser for a laser-produced plasma EUV light source having an optical isolator.

FIG. 6 shows another aspect of an embodiment of the present application in which an EUV light source may comprise an optical amplifier 606 and a target material 602, e.g., tin droplet moving on a linear trajectory from a droplet generator. For example, the optical amplifier 606 may be a CW pumped, multiple chamber, $CO_2$ laser amplifier amplifying light at a wavelength of 10.6 μm and having a relatively high two-pass gain (e.g. a two pass gain of about 10,000). As shown, the amplifier 606 may include a chain of amplifier chambers 606a-c, arranged in series. As shown, the amplifier 606 may include a chain of amplifier chambers 606a-c, arranged in series, each chamber having its own active media and excitation source, e.g. electrodes. Polarizer(s) and/or Brewster's windows may be employed in the amplifier 606 such that light exiting the amplifier has a primary polarization direction. FIG. 6 also shows that the EUV light source may include an optical isolator 612 which may be positioned along a beam path 610 extending through the amplifier 606 and interposed between the amplifier 606 and an irradiation site where a droplet will intersect with the beam path 610. The isolator 612 may include, for example, a phase retarder mirror which rotates back reflected light ninety degrees out of the primary polarization direction and an isolator mirror which absorbs light with the rotated polarization. For example, a suitable unit for use with $CO_2$ lasers may be obtained from Kugler GmbH, Heiligenberger Str. 100, 88682 Salem Germany under the trade name Queller and/or "isolator box". Typically, the optical isolator 612 functions to allow light to flow from the amplifier 606 to the droplet virtually unimpeded while allowing only about one percent of back-reflected light to leak through the optical isolator 612 and reach the amplifier 606.

In use, a droplet of target material 602 is placed on a trajectory passing through or near the beam path 610. In the absence of a droplet on the beam path 610, the optical isolator 612 guards the amplifier gain media against untimely photons, preserving the gain media's inversion until a droplet reaches the beam path 610. Then, with the droplet on or near the beam path 610, spontaneously emitted photons from the amplifier 606 may be scattered by the droplet and some scattered photons may leak through the optical isolator and subsequently travel though the amplifier 606. With this leakage, gains may exceed losses in the amplifier cavity. As shown, an optic 608 may be positioned to receive photons on path 610 from the amplifier 606 and direct the beam back through the amplifier 606 for subsequent interaction with the target material 602 to produce an EUV light emitting plasma. For this arrangement, the optic 608 may be, for example, a flat mirror, curved mirror, phase-conjugate mirror or corner reflector. An optical element 614, e.g., lens may be positioned to collimate light entering the amplifier 606 from the droplet and focus light traveling from the amplifier 606 to the droplet. Alternatively, or in addition to the optical isolator 612, a pulse shaping element may be disposed between the target material 602 and amplifier 606 such as a saturable absorbing material, e.g. a material whose light transmission increases with light intensity, e.g. $SF_6$ gas for use with light at a wavelength of 10.6 μm, may be used to guard the amplifier gain media against untimely photons, preserving the gain media's inversion until a droplet reaches the beam path 610.

Figure 7:
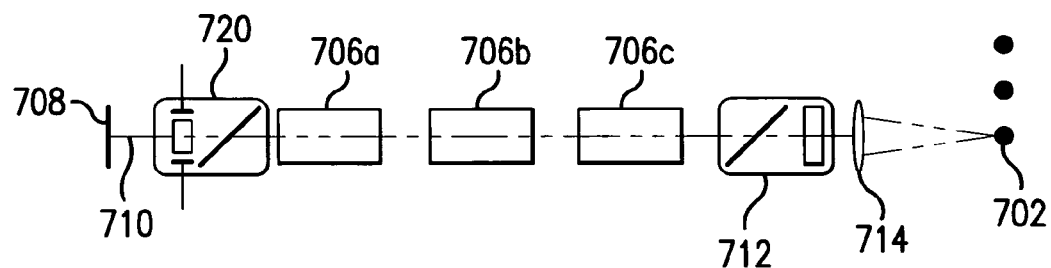
FIG. 7 shows a schematic, sectional view of another embodiment of a self targeting drive laser for a laser-produced plasma EUV light source having an electro-optic switch.

FIG. 7 shows another aspect of an embodiment of the present application in which an EUV light source has one or more components in common with the source shown in FIG. 6 and also includes a switch 720 having an electro-optic cell and a polarizer. In detail, the EUV light source shown in FIG. 7 includes an optical amplifier 706 (as described above for corresponding amplifier 606, having polarizer(s) and/or Brewster's windows such that light exiting the amplifier has a primary polarization direction), a target material 702, e.g. tin droplet (as described above), an optical isolator 712 (as described above having e.g. 100:1 efficiency), an optic 708 may be positioned to receive photons on path 710 from the amplifier 706 and direct the beam back through the amplifier 706 for subsequent interaction with the target material 702 to produce an EUV light emitting plasma, and a focusing optic 714 (as described above).

For the EUV light source shown in FIG. 7, the switch 720 (shown schematically) may include an electro-optic switch, e.g. Pockel's or Kerr cell, and a polarizer having a transmission axis aligned parallel to the primary polarization direction defined by the amplifier 706. Thus, when the switch is de-energized, light is able to pass between the amplifier 706 and optic 708, and, when the switch is energized, light is unable to pass from the optic 708 to the amplifier 706. In more quantitative terms, a typical setup may configured to provide an output power=10 kW. For this setup, the reflection from droplet may be about 0.01 and the Queller efficiency may be about 100:1. Thus, the back reflected power into the laser=10 kW*0.01/100=1 W, the double pass gain=10 kW/1 W=10,000, the single pass gain=Sqrt(10,000)=100, and the power at E/O switch=1 W*100=100 W.

In use, a droplet of target material 702 is placed on a trajectory passing through or near the beam path 710. Prior to the droplet reaching the beam path 710, the switch 720 is energized to guard the amplifier gain media against untimely photons, preserving the gain media's inversion until a droplet reaches the beam path 710. Then, with the droplet on or near the beam path 710, the switch 720 is de-energized, allowing photons to oscillate between the droplet and optic 708. Switch timing may be achieved using various techniques known in the pertinent art. In one setup, an auxiliary laser/detector pair (not shown), e.g. a HeNe laser, may be used to detect the position of the droplet, e.g. at a location distanced from the beam path, and provide an output signal for use in triggering the switch 720. With the arrangement shown in FIG. 7, selected droplets, e.g. every other droplet, can be allowed to pass through the beam path without irradiation. Such a scheme allows these non-participating droplets to shield the next participating droplet from the effects of the plasma, increasing the conversion efficiency provided by the next participating droplet.

Figure 8:
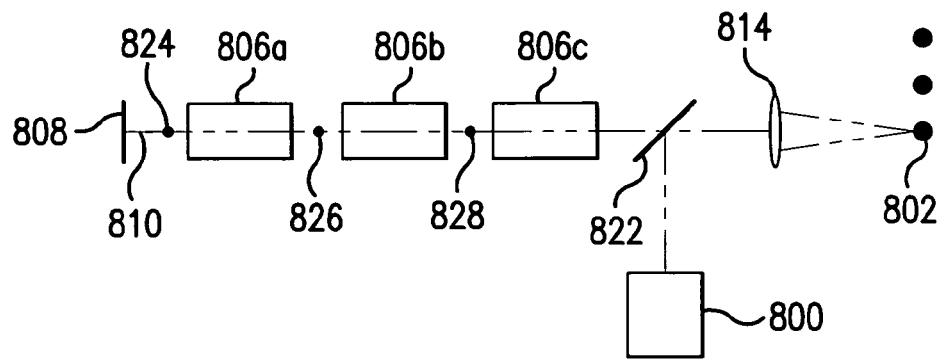
FIG. 8 shows a schematic, sectional view of another embodiment of a self targeting drive laser for a laser-produced plasma EUV light source having a radiant energy supply coupled to the drive laser.

FIG. 8 shows another aspect of an embodiment of the present application in which an EUV light source has one or more components in common with the source shown in FIG. 4 and also includes an optic 822 for coupling photons from a radiant energy supply 800, e.g. lamp or laser device, onto beam path 810 which extends through the amplifier 806. In more detail, the EUV light source shown in FIG. 8 includes an optical amplifier 806 (as described above for corresponding amplifier 406, having, for example, a two pass gain of about 10,000 and polarizer(s) and/or Brewster's windows such that light exiting the amplifier has a primary polarization direction). In addition, the EUV light source includes a target material 702, e.g. tin droplet (as described above), an optic 808 positioned to receive photons on path 810 from the amplifier 806 and direct the photons back through the amplifier 806 for subsequent interaction with the target material 802 to produce an EUV light emitting plasma, and a focusing optic 814 (as described above).

Several variations of FIG. 8 are possible. For example, the radiant energy supply 800 may generate light having a wavelength within the gain band of the amplifier 806, e.g. the amplifier 806 and supply 800 may both contain $CO_2$ active media. For this case, the radiant energy supply 800 may include polarizer(s) and/or Brewster's windows that are aligned such that light exiting the radiant energy supply 800 is polarized orthogonal to the primary polarization direction of the amplifier 806. In this arrangement, optic 822 may be a polarizer having its transmission axis aligned to reflect light from the radiant energy supply 800 and transmit light from the amplifier 806. In another setup, the radiant energy supply 800 may generate light having a wavelength within the gain band of the amplifier 806, e.g. the amplifier 806 may contain $CO_2$ active media and the supply may be Nd:YAG. For this case, the optic 822 may be a dichroic beamsplitter configured to reflect light from the radiant energy supply 800 and transmit light from the amplifier 806. In either case, light from the radiant energy supply 800 cannot directly reach the amplifier 806.

For the embodiment shown in FIG. 8, the EUV light source may be configured so that when a droplet of target material 802 initially reaches the beam path 810, its reflectivity is low and cavity losses exceed gains for the amplifier 806. Irradiation of the droplet by the radiant energy supply 800 increases the droplet's reflectivity until gains exceed losses in the amplifier cavity and a relatively high power laser beam is generated on the beam path 810 which interacts with the target material 802. The target material 802 then leaves the path 410 and the process is repeated with another droplet. The arrangement shown in FIG. 4 may be advantageous in that it is self-targeting, to the extent that the droplet passes near or through the beam path 410. For the embodiment shown in FIG. 8, the initial irradiation of the target material by the radiant energy supply 800 may be sufficient to expand the target material and/or vaporize the target material and/or create a partial plasma of the target material, e.g., a pre-pulse. Depending on the specific application, utilization of a pre-pulse followed by one or more main pulses may result in an improved conversion efficiency and/or a reduction in the amount of debris generated.

The skilled artisan will quickly appreciate that several variations on FIG. 8 embodiment may be employed. For example, the radiant energy supply 800 may be coupled to the beam path 810 at location 824, 826 or 828. Also, a switch, such as the switch 720, as described above with reference to FIG. 7, and/or an optical isolator, such as the optical isolator 612 as described above with reference to FIG. 6, may be employed in the FIG. 8 embodiment to protect the amplifier gain media from untimely photons.

Figure 9:
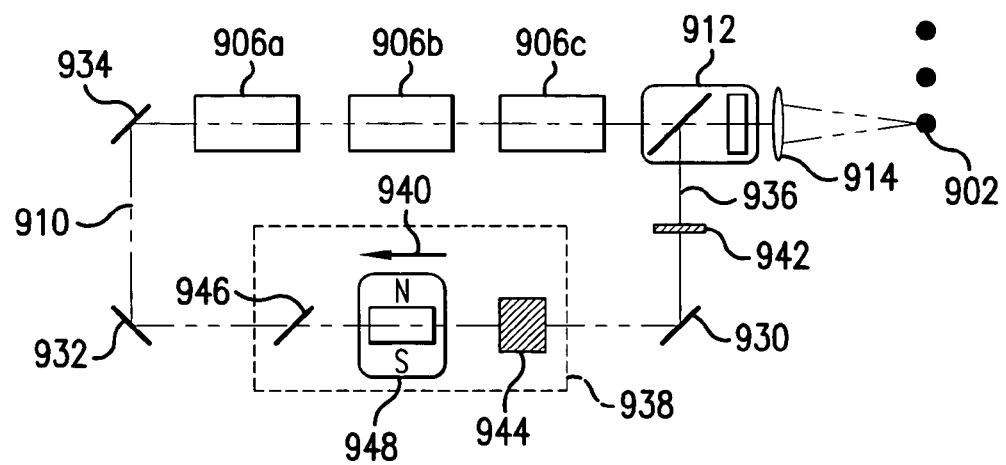
FIG. 9 shows a schematic, sectional view of another embodiment of a self targeting drive laser for a laser-produced plasma EUV light source having a beam path with a ring shaped portion and a Faraday isolator.

FIG. 9 shows another aspect of an embodiment of the present application in which an EUV light source has one or more components in common with the source shown in FIG. 6 and also includes optics (e.g. maximum reflectivity turning mirrors 930, 932, 934) which cooperate with the amplifier 906 to establish a beam path 910 have a ring shaped portion 936; and a Faraday isolator 938 allowing light travel along a single direction (arrow 940) in the ring shaped portion 936. Also shown, for some implementations, an attenuator 942 may be provided.

In greater detail, the EUV light source shown in FIG. 9 includes an optical amplifier 906 (as described above for corresponding amplifier 606, having polarizer(s) and/or Brewster's windows such that light exiting the amplifier has a primary polarization direction), a target material 902, e.g. tin droplet (as described above), an optical isolator 912 (as described above having e.g. 100:1 efficiency), and a focusing optic 914 (as described above).

For the EUV light source shown in FIG. 9, the Faraday isolator 938 includes a first polarizer 944 having a transmission axis aligned orthogonal to the primary polarization direction defined by the amplifier 906, a second polarizer 946 having a transmission axis aligned parallel to the primary polarization direction defined by the amplifier 906, and a Faraday rotator 948 which rotates light polarization by ninety degrees. With this cooperation of structure, light from the amplifier 906 is rotated ninety degrees by the optical isolator, scatters from the droplet, is rotated another ninety degrees and is reflected into the ring portion of the beam path 910 by the isolator 912. In more quantitative terms, a typical setup may configured to obtain an output power of about 10 kW. For this setup, reflection from droplet may be about 0.01; nearly all the reflected light from the plasma may goe to mirror 930 (through the attenuator 942). Thus, the back reflected power on the mirror 930=10 kW*0.01=100 W. If 100× attenuator is used, the power is reduced to 1 W. For this setup, the single pass gain required 100× without attenuator and 10.000× with 100× attenuator.

Figure 10:
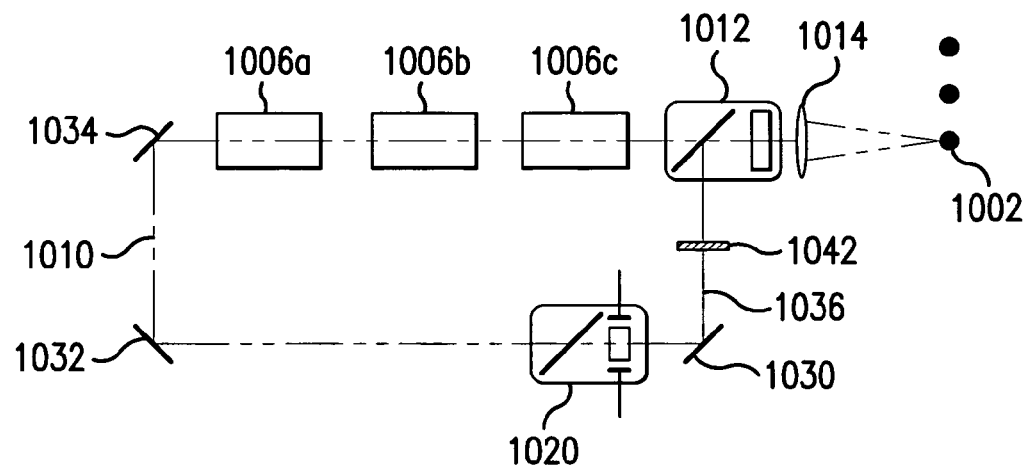
FIG. 10 shows a schematic, sectional view of another embodiment of a self targeting drive laser for a laser-produced plasma EUV light source having a beam path with a ring shaped portion, a Faraday isolator and an electro-optic switch.

FIG. 10 shows another aspect of an embodiment of the present application in which an EUV light source has one or more components in common with the source shown in FIG. 9 and also includes a switch 1020 having an electro-optic cell and a polarizer. In more detail, the EUV light source shown in FIG. 10 includes an optical amplifier 1006a,b,c (as described above for corresponding amplifier 906, having polarizer(s) and/or Brewster's windows such that light exiting the amplifier has a primary polarization direction), a target material 1002, e.g. tin droplet (as described above), an optical isolator 1012 (as described above having e.g. 100:1 efficiency), optics (e.g. turning mirrors 1030, 1032, 1034) which cooperate with the amplifier 1006 to establish a beam path 1010 have a ring shaped portion 1036 and a focusing optic 1014 (as described above). Also shown, for some implementations, an attenuator 1042 may be provided.

For the EUV light source shown in FIG. 10, the switch 1020 (shown schematically) may include an electro-optic cell, e.g. Pockel's or Kerr cell, and a polarizer having a transmission axis aligned parallel to the primary polarization direction defined by the amplifier 1006. Thus, when the switch is de-energized, light is unable to pass from optical isolator 1012 to optic 1032.

In more quantitative terms, a typical setup may configured such that output power=10 kW; reflection from droplet=0.01; all the reflected light from the plasma goes to mirror 1030 (through the attenuator 1042), back reflected power on the mirror 1030=10 kW*0.01=100 W. If 100× attenuator is used, the power is reduced to 1 W. For this setup, the single pass gain required is 100× without the attenuator and is 10,000× with a 100× attenuator.

In use, a droplet of target material 1002 is placed on a trajectory passing through or near the beam path 1010. Prior to the droplet reaching the beam path 1010, the switch 1020 is de-energized to guard the amplifier gain media against untimely photons, preserving the gain media's inversion until a droplet reaches the beam path 1010. Then, with the droplet on or near the beam path 1010, the switch 1020 is energized, allowing photons to circulate in the ring shaped portion 1036. Switch timing and the ability to shield using non-participating droplets as discussed above with reference to FIG. 7 is also applicable to FIG. 10.

Figure 10A:
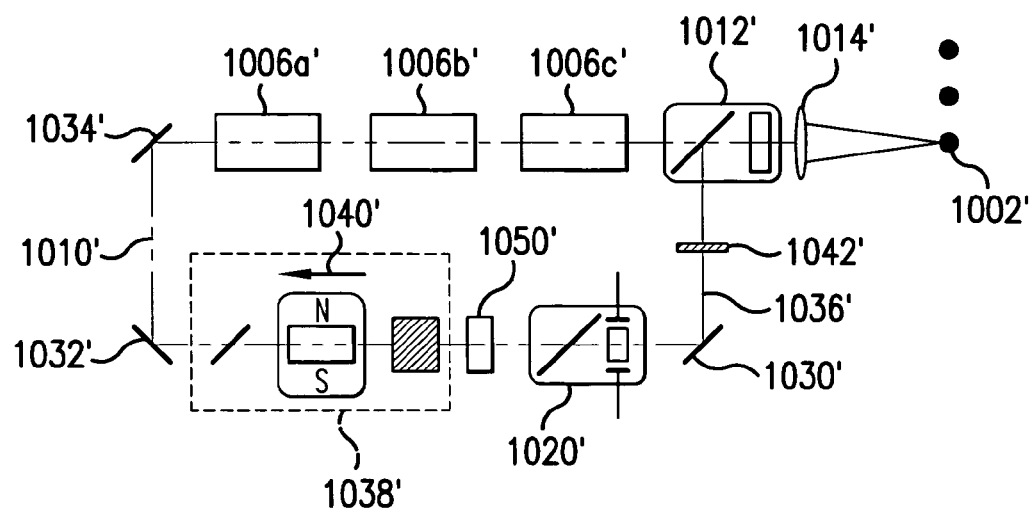

FIG. 10A shows another aspect of an embodiment of the present application in which an EUV light source has one or more components in common with the source shown in FIG. 10 and also includes a Faraday isolator 1038' (as described above) allowing light travel along a single direction (arrow 1040') in the ring shaped portion 1036' and a half wave plate 1050' positioned on the beam path between the Faraday isolator 1038' and the switch 1020'.

In more detail, the EUV light source shown in FIG. 10A includes an optical amplifier 1006a',b',c' (as described above for corresponding amplifier 906a,b,c, having polarizer(s) and/or Brewster's windows such that light exiting the amplifier has a primary polarization direction), a target material 1002', e.g. tin droplet (as described above), an optical isolator 1012' (as described above having e.g. 100:1 efficiency), optics (e.g. turning mirrors 1030', 1032', 1034') which cooperate with the amplifier 1006' to establish a beam path 1010' have a ring shaped portion 1036'; a switch 1020' (as described above) having an electro-optic cell and a polarizer (having transmission axis aligned parallel to the primary polarization direction defined by the amplifier) and a focusing optic 1014' (as described above). Also shown, for some implementations, an attenuator 1042' may be provided.

In use, a droplet of target material 1002' is placed on a trajectory passing through or near the beam path 1010'. Prior to the droplet reaching the beam path 1010', the switch 1020' is de-energized to guard the amplifier gain media against untimely photons, preserving the gain media's inversion until a droplet reaches the beam path 1010'. Then, with the droplet on or near the beam path 1010', the switch 1020' is energized, allowing photons to circulate in the ring shaped portion 1036'. Switch timing and the ability to shield using non-participating droplets as discussed above with reference to FIG. 7 is also applicable to FIG. 10A.

Figure 11:
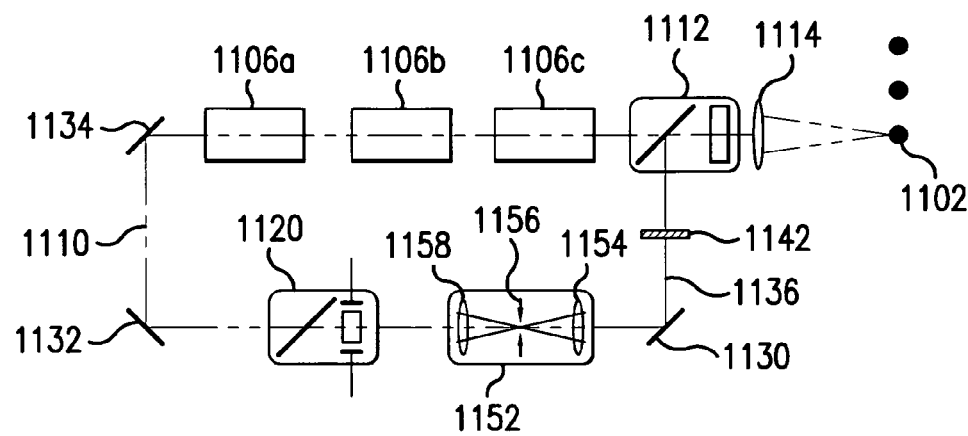
FIG. 11 shows a schematic, sectional view of another embodiment of a self targeting drive laser for a laser-produced plasma EUV light source having a beam path with a ring shaped portion, a Faraday isolator, electro-optic switch and a spatial filter.

FIG. 11 shows another aspect of an embodiment of the present application in which an EUV light source has one or more components in common with the source shown in FIG. 10 and also includes a spatial filter 1152 eliminating some diverging photons which would otherwise waste gain media. As shown, the spatial filter 1152 may include, e.g. a first lens 1154 focusing the beam to a spot at a location, a stop 1156 formed with an aperture, e.g. circular aperture, positioned at the location reflecting, refracting and/or absorbing photons not passing through the aperture, and a collimating lens 1158.

In more detail, the EUV light source shown in FIG. 11 includes an optical amplifier 1106a,b,c (as described above for corresponding amplifier 906, having polarizer(s) and/or Brewster's windows such that light exiting the amplifier has a primary polarization direction), a target material 1102, e.g. tin droplet (as described above), an optical isolator 1112 (as described above having e.g. 100:1 efficiency), optics (e.g. turning mirrors 1130, 1132, 1134) which cooperate with the amplifier 1106 to establish a beam path 1110 have a ring shaped portion 1136, a focusing optic 1114 (as described above) and a switch 1120 (shown schematically) which may include an electro-optic cell, e.g. pockel's or Kerr cell, and a polarizer having a transmission axis aligned parallel to the primary polarization direction defined by the amplifier 1106. Also shown, for some implementations, an attenuator 1142 may be provided. In more quantitative terms, a typical setup may configured such that output power=10 kW; reflection from droplet=0.01; all the reflected light from the plasma goes to mirror 1130 (through the attenuator 1142), back reflected power on the mirror 1130=10 kW*0.01=100 W. If 100× attenuator is used, the power is reduced to 1 W, single pass gain required 100× without attenuator and 10,000× with 100× attenuator.

Figure 11A:
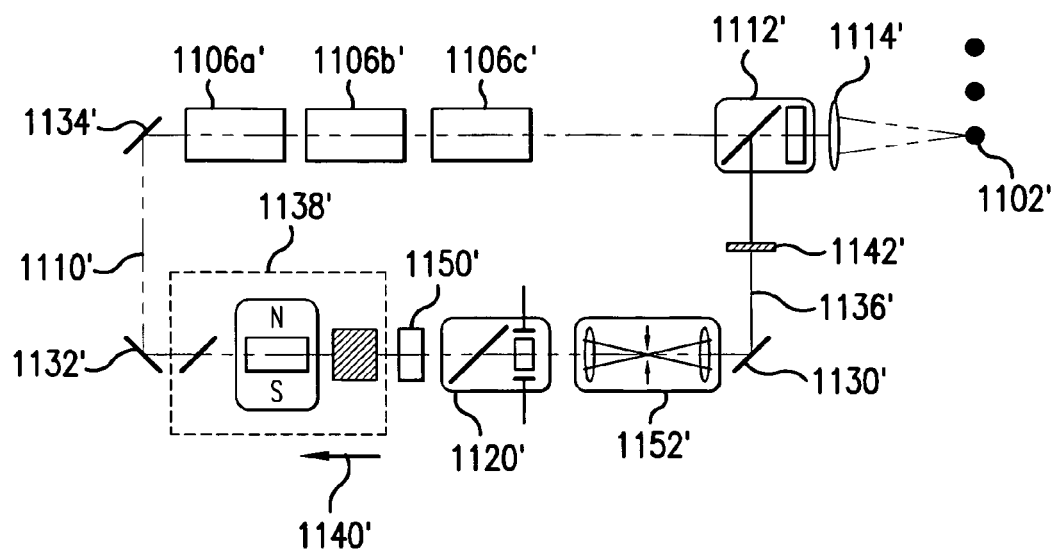

FIG. 11A shows another aspect of an embodiment of the present application in which an EUV light source has one or more components in common with the source shown in FIG. 11 and also includes a Faraday isolator 1138' (as described above) allowing light travel along a single direction (arrow 1140') in the ring shaped portion 1136' and a half wave plate 1150' positioned on the beam path between the Faraday isolator 1138' and the switch 1120'.

In more detail, the EUV light source shown in FIG. 11A includes an optical amplifier 1106a',b',c' (as described above for corresponding amplifier 906, having polarizer(s) and/or Brewster's windows such that light exiting the amplifier has a primary polarization direction), a target material 1102', e.g. tin droplet (as described above), an optical isolator 1112' (as described above having e.g. 100:1 efficiency), optics (e.g. turning mirrors 1130', 1132', 1134') which cooperate with the amplifier 1106' to establish a beam path 1110' have a ring shaped portion 1136', a focusing optic 1114' (as described above), a spatial filter 1152' (as described above) and a switch 1120' (shown schematically) which may include an electro-optic cell, e.g. pockel's or Kerr cell, and a polarizer having a transmission axis aligned parallel to the primary polarization direction defined by the amplifier 1106'. Also shown, for some implementations, an attenuator 1142' may be provided. In more quantitative terms, a typical setup may configured such that output power=10 kW; reflection from droplet=0.01; all the reflected light from the plasma goes to mirror 1130 (through the attenuator 1142), back reflected power on the mirror 1130=10 kW*0.01=100 W. If 100× attenuator is used, the power is reduced to 1 W, single pass gain required 100× without attenuator and 10,000× with 100× attenuator.

Figure 12:
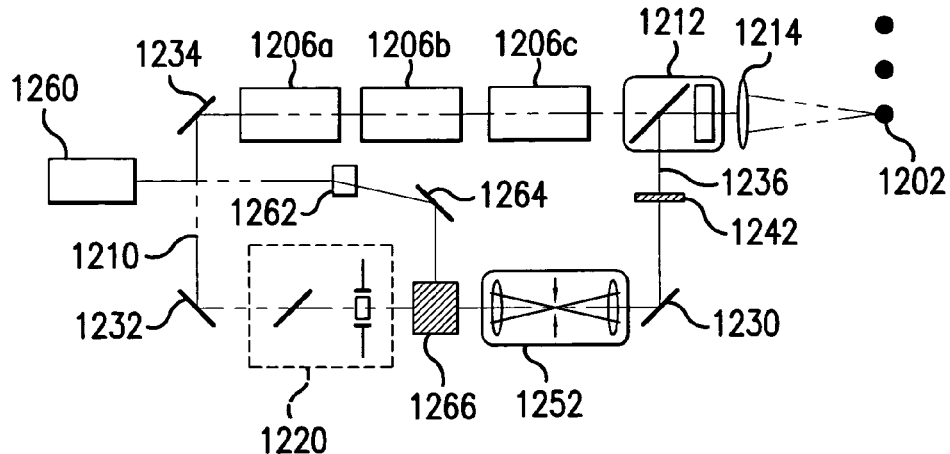
FIG. 12 shows a schematic, sectional view of another embodiment of a self targeting drive laser for a laser-produced plasma EUV light source having a beam path with a ring shaped portion and a radiant energy supply coupled to the beam path.

FIG. 12 shows another aspect of an embodiment of the present application in which an EUV light source has one or more components in common with the source shown in FIG. 11 and also includes a seed laser 1260, e.g. optical oscillator, coupled with the beam path 1210 to introduce photons onto the ring shaped portion 1236 of the beam path 1210 to provide an initial photon interaction with the target material 1202. In greater detail, the EUV light source shown in FIG. 12 includes an optical amplifier 1206a,b,c (as described above for corresponding-amplifier 1106, having polarizer(s) and/or Brewster's windows such that light exiting the amplifier has a primary polarization direction), a target material 1202, e.g. tin droplet (as described above), an optical isolator 1212 (as described above having e.g. 100:1 efficiency), optics (e.g. turning mirrors 1230, 1232, 1234) which cooperate with the amplifier 1206 to establish a beam path 1210 have a ring shaped portion 1236; a focusing optic 1214 (as described above), a switch 1220 (shown schematically) which may include an electro-optic cell, e.g. pockel's or Kerr cell, and a polarizer having a transmission axis aligned parallel to the primary polarization direction defined by the amplifier 1206 and a spatial filter 1252 (as described above). Also shown, for some implementations, an attenuator 1242 may be provided.

For the embodiment shown in FIG. 12, the seed laser 1260 may include polarizer(s) and/or brewsters windows such that light exiting the seed laser 1260 has a polarization direction that is at an angle, e.g. ninety degrees, relative to the primary polarization direction defined by the amplifier 1206. It can be seen that the EUV light source shown in FIG. 12 may also include an acousto-optic modulator 1262, maximum reflectivity turning mirror 1264 and polarizer 1266 having a transmission axis aligned orthogonal to the primary polarization direction defined by the amplifier 1206. With this arrangement, the acousto-optic modulator 1262 may be energized to place one or more light pulse(s) exiting the seed laser 1260 onto the ring shaped portion 1236 of the beam path 1210 whereupon the light pulse(s) will pass through the amplifier 1206, be amplified, and thereafter provide an initial photon interaction with the target material 1202, altering the reflectivity of the target material 1202.

In use, a droplet of target material 1202 is placed on a trajectory passing through or near the beam path 1210. Prior to the droplet reaching the beam path 1210, the switch 1220 is de-energized to guard the amplifier gain media against untimely photons, preserving the gain media's inversion until a droplet reaches the beam path 1210. Then, with the droplet on or near the beam path 1210, the switch 1250 and acousto-optic modulator 1262 are energized (typically the modulator 1262 is energized first due to its slower response), allowing photons to circulate in the ring shaped portion 1236. Switch timing and the ability to shield using non-participating droplets as discussed above with reference to FIG. 7 may also applicable to FIG. 12.

Figure 12A:
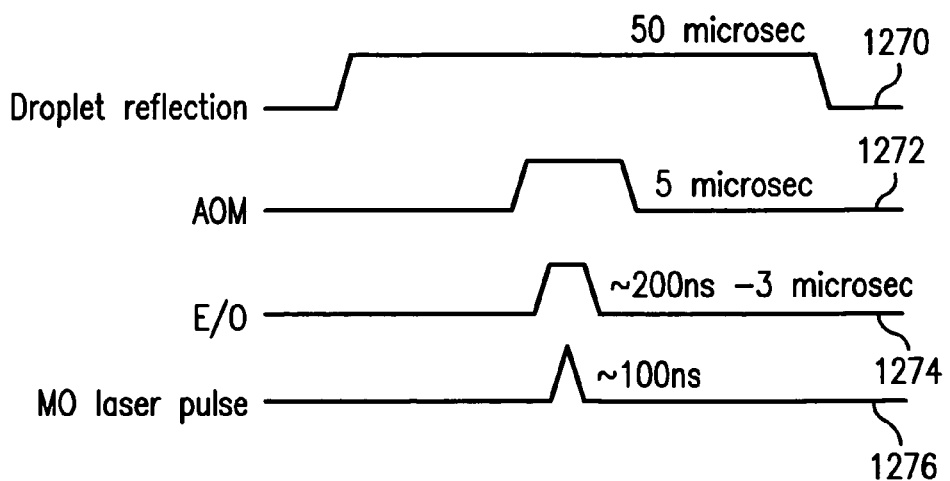
FIG. 12A shows an example of a droplet reflection timing curve, a acousto-optic modulator timing curve, an electro-optic switch timing curve 1274, and a seed laser pulse timing curve for the drive laser shown in FIG. 12.

FIG. 12A shows a droplet reflection timing curve 1270, a acousto-optic modulator timing curve 1272 (shown relative to curve 1270), an electro-optic switch timing curve 1274 (shown relative to curves 1270 and 1272), and a seed laser pulse timing curve 1276 (shown relative to curves 1270, 1272 and 1274). As illustrated by FIG. 12A, and partially described above, energizing the switch 1250 and acousto-optic modulator 1262 will result in one or more amplified pulses providing an initial photon interaction with the target material 1202, altering the reflectivity of the target material 1202. The acousto-optic modulator 1262 may then be de-energized, removing the seed laser 1260 from the ring shaped portion 1236. Next, with the increased droplet reflectivity, gains will exceed losses in the ring amplifier resulting in an amplified photon beam which interacts with the target material 1202 to produce an EUV light emitting plasma (note: the seed laser 1260 sets the dominant direction for the ring laser).

Figure 13:
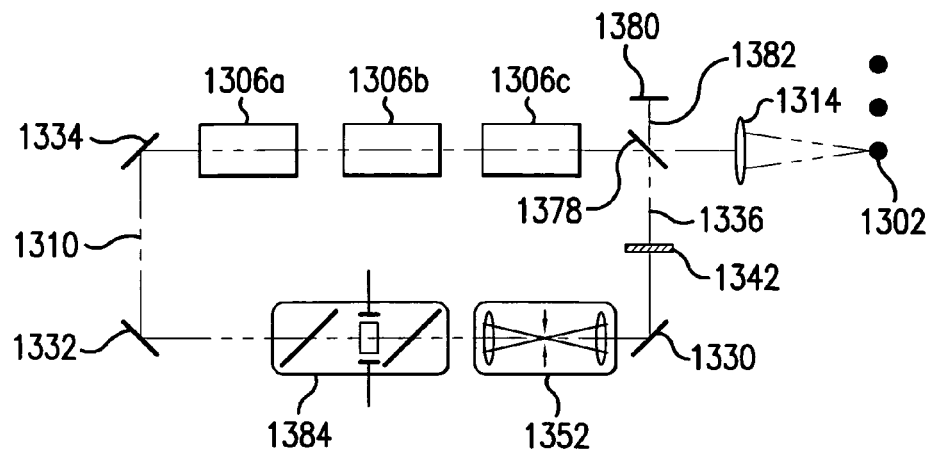
FIG. 13 shows a schematic, sectional view of another embodiment of a self targeting drive laser for a laser-produced plasma EUV light source having a beam path with a ring shaped portion and partial reflective output coupler and mirror for defining the direction of light travel on the ring.

FIG. 13 shows another aspect of an embodiment of the present application in which an EUV light source has one or more components in common with the source shown in FIG. 11 and also includes a partial reflector 1378 operable as an output coupler for the ring shaped portion 1336 of the beam path 1310, and a reflector 1380, e.g. maximum reflectivity mirror, to define the direction of light travel within the ring shaped portion 1336 of the beam path 1310.

In greater detail, the EUV light source shown in FIG. 13 includes an optical amplifier 1306a,b,c (as described above for corresponding amplifier 1106, having polarizer(s) and/or Brewster's windows such that light exiting the amplifier has a primary polarization direction), a target material 1302, e.g. tin droplet (as described above), optics (e.g. turning mirrors 1330, 1332, 1334) which cooperate with the amplifier 1306 to establish a beam path 1310 having a ring shaped portion 1336; a focusing optic 1314 (as described above), a spatial filter 1352 (as described above) and a switch 1384 (shown schematically) which may include an electro-optic cell, e.g. Pockel's or Kerr cell, disposed between two polarizers, each having a transmission axis aligned parallel to the primary polarization direction defined by the amplifier 1306. Also shown, for some implementations, an attenuator 1342 may be provided.

For the embodiment shown in FIG. 13, the partial reflector 1378 may be positioned on the beam path 1310 between the amplifier 1306*a,b,c* and the target material 1302. Portions of the beam from the amplifier will transmit through the partial reflector 1378 for interaction with the target material 1302 and the remainder will be reflected onto the ring shaped portion 1336 of the beam path 1310. Light reflected from the target material 1302 will be reflected onto path 1382. As shown, reflector 1380 may be positioned on path 1382 to reflect light back toward the partial reflector 1378 where a portion of the light will be reflected toward the target material 1302 and a portion of the light will be transmitted to the ring shaped portion 1336 of the beam path 1310.

In use, a droplet of target material 1302 is placed on a trajectory passing through or near the beam path 1310. Prior to the droplet reaching the beam path 1310, the switch 1384 is energized to guard the amplifier gain media against untimely photons, preserving the gain media's inversion until a droplet reaches the beam path 1310. Then, with the droplet on or near the beam path 1310, the switch 1384 is de-energized, allowing photons to circulate in the ring shaped portion 1336. Switch timing and the ability to shield using non-participating droplets as discussed above with reference to FIG. 7 may also applicable to FIG. 13.

Figure 14:
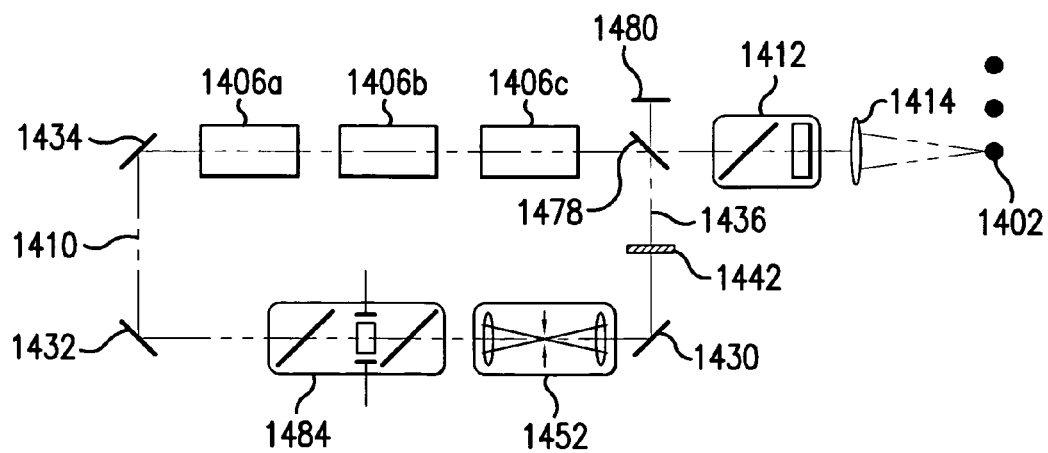
FIG. 14 shows a schematic, sectional view of another embodiment of a self targeting drive laser for a laser-produced plasma EUV light source having a beam path with a ring shaped portion, a partial reflective output coupler and mirror for defining the direction of light travel on the ring, and an optical isolator.

FIG. 14 shows another aspect of an embodiment of the present application in which an EUV light source has one or more components in common with the source shown in FIG. 13 and also includes an optical isolator 1412 (as described above having e.g. 100:1 efficiency) positioned along the beam path 1410 between the partial reflector 1478 and the target material 1402.

In greater detail, the EUV light source shown in FIG. 14 includes an optical amplifier 1406*a,b,c* (as described above for corresponding amplifier 1106, having polarizer(s) and/or Brewster's windows such that light exiting the amplifier has a primary polarization direction), a target material 1402, e.g. tin droplet (as described above), optics (e.g. turning mirrors 1430, 1432, 1434) which cooperate with the amplifier 1406 to establish a beam path 1410 having a ring shaped portion 1436; a focusing optic 1414 (as described above), a partial reflector 1478 (as described above) operable as an output coupler for the ring shaped portion 1436 of the beam path 1410, and a reflector 1480 (as described above) to define the direction of light travel within the ring shaped portion 1436 of the beam path 1410, a switch 1484 (as described above for switch 1384) and a spatial filter 1452 (as described above). Also shown, for some implementations, an attenuator 1442 may be provided.

In use, a droplet of target material 1402 is placed on a trajectory passing through or near the beam path 1410. Prior to the droplet reaching the beam path 1410, the switch 1484 is energized to guard the amplifier gain media against untimely photons, preserving the gain media's inversion until a droplet reaches the beam path 1410. Then, with the droplet on or near the beam path 1410, the switch 1484 is de-energized, allowing photons to circulate in the ring shaped portion 1436. Switch timing and the ability to shield using non-participating droplets as discussed above with reference to FIG. 7 may also applicable to FIG. 14.

Figure 15:
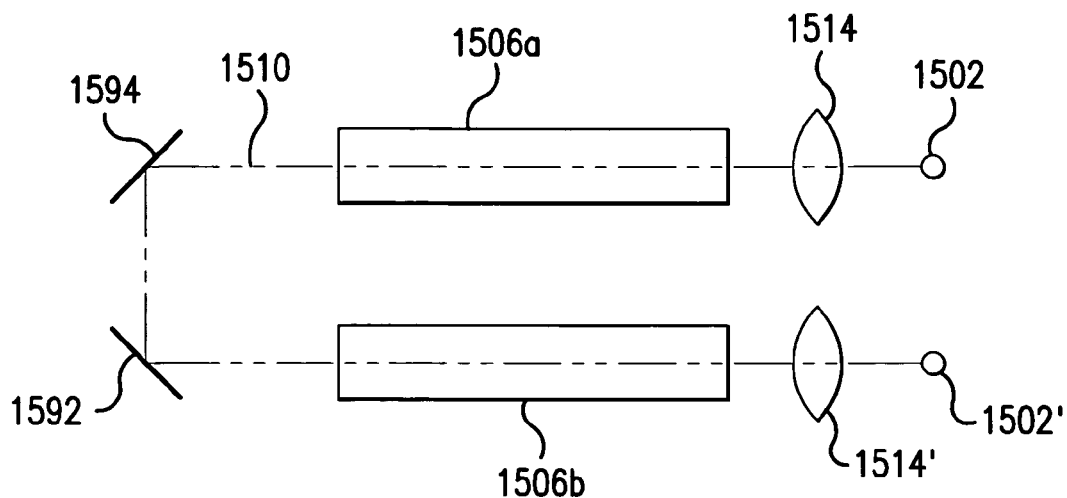
FIG. 15 shows a schematic, sectional view of another embodiment of a self targeting drive laser for a laser-produced plasma EUV light source in which an oscillation cavity may be established between two droplets of EUV line-emitting material.

FIG. 15 shows another aspect of an embodiment of the present application in which an EUV light source may establish an oscillation cavity on a beam path 1510 between two target materials 1502, 1502' (as described above), e.g. two tin droplets. In greater detail, the EUV light source shown in FIG. 15 may include an optical amplifier 1506*a,b* (as described above, note: more than two and as few as one amplifier chamber may be used in the FIG. 15 embodiment), and optics 1592, 1594, e.g. maximum reflectivity turning mirrors, and a focusing optics 1514, 1514' (as described above).

Figure 16:
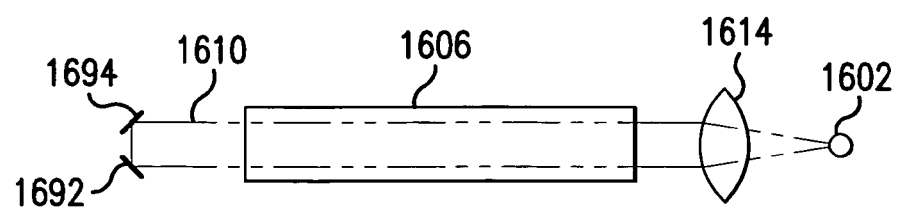
FIG. 16 shows a schematic, sectional view of another embodiment of a self targeting drive laser for a laser-produced plasma EUV light source in which a single droplet may act as a reflector on both ends of an oscillation cavity.

FIG. 16 shows another aspect of an embodiment of the present application in which an EUV light source may establish an oscillation cavity on a beam path 1610 between a single target materials 1602 (as described above), e.g. tin droplet. In greater detail, the EUV light source shown in FIG. 15 may include an optical amplifier 1506*a* (as described above, note: more than one amplifier chamber may be used in the FIG. 16 embodiment), and optics 1692, 1694, e.g. maximum reflectivity turning mirrors, and a focusing optic 1614 (as described above).

It is to be appreciated that the embodiments shown in FIGS. 15 and 16 can be modified to include the use of one or more spatial filter(s) (as described above), optical isolator(s) (as described above), switches (as described above, e.g. switch 720), attenuators (as described above), Faraday isolators (as described above) and/or seed laser(s) (as described above), coupled with the beam path 1610 to provide an initial photon interaction with target material.

For the embodiments described above (i.e. FIGS. 4-16), suitable amplifiers have been described as including, but not necessarily limited to, one or more amplifying chambers having gain media that is continuously pumped (e.g. CW). However, each of these embodiments (i.e. FIGS. 4-16) may be modified such that one or more of the amplifying chambers is selectively pumped, e.g. pulsed, to function as a switch similar to the function of the electro-optic switch described above. Moreover, for these (i.e. FIGS. 4-16), the amplifier gain media may be, but is not limited to gas discharge gain media, e.g. excimer, $CO_2$, etc and/or solid state, e.g. Er:YAG, in the form of fibers, disks, etc.

It will be understood by those skilled in the art that aspects of embodiments of the subject matter disclosed above are intended to satisfy the requirement of disclosing at least one enabling embodiment of the subject matter of each claim and to be one or more such exemplary embodiments only and to not to limit the scope of any of the claims in any way and particularly not to a specific disclosed embodiment alone. Many changes and modification can be made to the disclosed aspects of embodiments of the disclosed subject matter of the claims that will be understood and appreciated by those skilled in the art, particularly in regard to interpretation of the claims for purposes of the doctrine of equivalents. The appended claims are intended in scope and meaning to cover not only the disclosed aspects of embodiments of the claimed subject matter but also such equivalents and other modifications and changes that would be apparent to those skilled in the art. In additions to changes and modifications to the disclosed and claimed aspects of the subject matter disclosed of the present invention(s) noted above, others could be implemented.

While the particular aspects of embodiment(s) of the DRIVE LASER DELIVERY SYSTEMS FOR EUV LIGHT SOURCE described and illustrated in this patent application in the detail required to satisfy 35 U.S.C. §112 is fully capable of attaining any above-described purposes for, problems to be solved by or any other reasons for or objects of the aspects of an embodiment(s) above described, it is to be understood by those skilled in the art that it is the presently described aspects of the described embodiment(s) of the subject matter claimed are merely exemplary, illustrative and representative of the subject matter which is broadly contemplated by the claimed subject matter. The scope of the presently described and claimed aspects of embodiments fully encompasses other embodiments which may now be or may become obvious to those skilled in the art based on the teachings of the Specification. The scope of the present DRIVE LASER DELIVERY SYSTEMS FOR EUV LIGHT SOURCE is solely and completely limited by only the appended claims and nothing beyond the recitations of the appended claims. Reference to an element in such claims in the singular is not intended to mean nor shall it mean in interpreting such claim element "one and only one" unless explicitly so stated, but rather "one or more". All structural and functional equivalents to any of the elements of the above-described aspects of an embodiment(s) that are known or later come to be known to those of ordinary skill in the art are expressly incorporated herein by reference and are intended to be encompassed by the present claims. Any term used in the Specification and/or in the claims and expressly given a meaning in the Specification and/or claims in the present application shall have that meaning, regardless of any dictionary or other commonly used meaning for such a term. It is not intended or necessary for a device or method discussed in the Specification as any aspect of an embodiment to address each and every problem sought to be solved by the aspects of embodiments disclosed in this application, for it to be encompassed by the present claims. No element, component, or method step in the present disclosure is intended to be dedicated to the public regardless of whether the element, component, or method step is explicitly recited in the claims. No claim element in the appended claims is to be construed under the provisions of 35 U.S.C. §112, sixth paragraph, unless the element is expressly recited using the phrase "means for" or, in the case of a method claim, the element is recited as a "step" instead of an "act."

We claim:

1. A method of creating EUV light comprising the acts of:
   establishing an irradiation site;
   locating an optic at a position to establish a beam path with the irradiation site;
   disposing an optical gain medium along the beam path; and
   positioning a target material at the irradiation site to produce an amplified photon beam for interaction with the target material to produce an EUV light emitting plasma without a seed laser providing output photons to the beam path.

2. A method as recited in claim 1 wherein the optic and the target material cooperate to establish an optical oscillator.

3. A method as recited in claim 1 wherein the target material is in the form of a droplet.

4. A method as recited in claim 1 wherein the optic is selected from the group of optics consisting of a flat mirror, a curved mirror, a corner reflector and a phase-conjugate mirror.

5. A method as recited in claim 1 wherein the target material comprises tin and the optical gain medium comprises $CO_2$.

6. A method as recited in claim 1 further comprising the act of;
   positioning an optical isolator along the beam path between the target material and optical gain medium.

7. A method as recited in claim 6 wherein the optical isolator comprises a saturable absorber.

8. A method as recited in claim 1 further comprising directing light onto the target material such that photons of the light are scattered from the target material and placed on the beam path to thereby produce the amplified photon beam.

9. A method as recited in claim 8 wherein directing light onto the target material comprises increases reflectivity of the target material.

10. A method as recited in claim 8 wherein directing light onto the target material causes the initiation of lasing in the optical gain medium.

11. A method as recited in claim 1 wherein positioning the target material at the irradiation site to produce the amplified photon beam includes positioning the target material so that the target material scatters spontaneously emitted photons from the optical gain medium and at least some photons scattered from the target material are placed on the beam path to thereby produce the amplified photon beam.

12. A method as recited in claim 1 wherein establishing the beam path comprises establishing the beam path between the optic and the irradiation site.

13. A method as recited in claim 12 further comprising directing light from a light source external to the beam path and onto the target material such that photons of the light are scattered from the target material and placed on the beam path to thereby produce the amplified photon beam.

14. An EUV light source comprising:
   an optic positioned to reflect light on a beam path;
   a target material positionable at an irradiation site on said beam path to establish an optical cavity with said optic; and
   a gain medium coupled to said beam path such that optical gains exceed optical losses in said cavity to thereby produce an amplified photon beam that interacts with the target material to produce an EUV light emitting plasma without a seed laser providing output photons to the beam path.

15. An EUV light source as recited in claim 14 wherein the target material is in the form of a droplet.

16. An EUV light source as recited in claim 14 wherein the target material comprises tin and the gain medium comprises $CO_2$.

17. An EUV light source as recited in claim 14 further comprising an optical isolator positioned along the beam path between the target material and gain medium.

18. An EUV light source as recited in claim 17 wherein the optical isolator comprises a saturable absorber.

19. An EUV light source as recited in claim 14 wherein the optic is positioned along the beam path between the target material and the gain medium, the optic converging light on the beam path toward the target material.

20. An EUV light source as recited in claim 14 further comprising a radiant energy supply directing light onto the target material such that photons of the light are scattered from the target material and placed on the beam path to thereby produce the amplified photon beam.

21. An EUV light source as recited in claim 20, wherein the radiant energy supply includes a laser device.

22. An EUV light source as recited in claim 14 further comprising an excitation source for the gain medium that produces spontaneously emitted photons at least some of which are scattered from the target material along the beam path to thereby produce the amplified photon beam.

23. A method of creating EUV light comprising the acts of:
   aligning an optic to reflect light on a beam path;
   positioning a target material at an irradiation site on said beam path to establish an optical cavity with said optic; and
   coupling a gain medium to said beam path such that optical gains exceed optical losses in said cavity to thereby produce an amplified photon beam that interacts with the target material to produce an EUV light emitting plasma without a seed laser providing output photons to the beam path.

24. A method as recited in claim 23 further comprising the act of;
positioning an optical isolator along the beam path between the target material and gain medium.

25. A method as recited in claim 23 further comprising the act of:
positioning the optic along the beam path between the target material and the gain medium, the optic converging light on the beam path toward the target material.

* * * * *